United States Patent
Kim

(10) Patent No.: US 7,425,510 B2
(45) Date of Patent: Sep. 16, 2008

(54) METHODS OF CLEANING PROCESSING CHAMBER IN SEMICONDUCTOR DEVICE FABRICATION EQUIPMENT

(75) Inventor: Young-Ju Kim, Seongnam-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 11/702,568

(22) Filed: Feb. 6, 2007

(65) Prior Publication Data

US 2008/0041819 A1    Feb. 21, 2008

(30) Foreign Application Priority Data

Aug. 17, 2006   (KR) ............... 10-2006-0077624

(51) Int. Cl.
   *H01L 21/302*   (2006.01)
   *H01L 21/461*   (2006.01)
(52) U.S. Cl. ............ 438/706; 438/714; 438/725; 216/67; 216/76; 134/1.1
(58) Field of Classification Search ........... 134/1.1; 438/706, 714, 725; 216/67, 68, 76
See application file for complete search history.

(56) References Cited

U.S. PATENT DOCUMENTS

| | | | |
|---|---|---|---|
| 5,254,505 A * | 10/1993 | Kamiyama | 438/785 |
| 5,667,917 A | 9/1997 | Edwards et al. | |
| 6,426,911 B1 | 7/2002 | Lehmann et al. | |
| 2005/0087297 A1* | 4/2005 | Kitsunai et al. | 156/345.24 |
| 2005/0130427 A1* | 6/2005 | Won et al. | 438/689 |
| 2005/0201165 A1 | 9/2005 | Ashizawa | |
| 2005/0276369 A1 | 12/2005 | Mataguchi | |
| 2007/0010096 A1* | 1/2007 | Shin et al. | 438/689 |

* cited by examiner

*Primary Examiner*—Duy-Vu N Deo
(74) *Attorney, Agent, or Firm*—Volentine & Whitt, PLLC

(57) ABSTRACT

Methods of cleaning a processing chamber of semiconductor device fabrication equipment are highly effective in removing polymers produced as a by-product of a fabrication process from surfaces in a processing chamber. The cleaning process uses a plasma etchant produced from cleaning gas including an O-based gas and at least one gas selected from the group consisting of an F-based gas and a Cl-based gas. The polymer is dissolved in-situ using the plasma etchant. Thus, frequency at which PM (preventative maintenance) of the equipment must be performed is minimized, and the method contributes to maximizing the yield and quality of the semiconductor devices.

3 Claims, 6 Drawing Sheets

METHODS OF CLEANING PROCESSING CHAMBER IN SEMICONDUCTOR DEVICE FABRICATION EQUIPMENT

BACKGROUND OF THE INVENTION

1. Field of the Invention

The present invention relates to semiconductor device fabrication equipment. More particularly, the present invention relates to a method of cleaning the inside of a processing chamber of semiconductor device fabrication equipment.

2. Description of the Related Art

Semiconductor devices are constantly being improved in accordance with rapid developments in the fields of information processing and communications and along with the growing popularity of personal computers and the like. In particular, today's semiconductor devices must operate at high speeds, must store large amounts of information and yet must be compact. To this end, memory cells of semiconductor devices must be kept as small as possible and the devices must be highly integrated. However, the utmost accuracy is required in carrying out the individual processes required for fabricating compact and highly integrated semiconductor devices. That is, process margins in the fabricating of semiconductor devices become smaller as the devices become more highly integrated.

In general, a semiconductor device is made up of various geometrical circuit structures. These structures are fabricated by selectively and repeatedly performing several individual processes on a semiconductor wafer. These processes include: an ion implantation process of implanting 3B (for example, B) or 5B (for example, P or As) group impurity ions into the semiconductor wafer, a thin film deposition process of forming an insulating or conductive layer on the semiconductor wafer, an etching process of etching the layer formed by the thin film deposition process to thereby pattern the layer, a process of forming an interlayer insulating layer over the patterned layer, and a chemical mechanical polishing (CMP) process of polishing the wafer to remove steps formed as the result of forming the interlayer insulating layer on the patterned layer. The deposition and etching processes, in particular, are performed in processing chambers. The inside of such processing chambers must be periodically cleaned to remove particles and the like which may potentially contaminate the wafers.

Of the abovementioned individual processes, the etching process is one of the most frequently performed processes in semiconductor device fabrication. The etching process is carried out while a mask (a patterned film of photosensitive material) is disposed over the layer of material to be etched (target layer). The etching process removes a portion of the target layer that is exposed by the mask. Etching is largely divided into wet and dry etching processes. Wet etching uses a chemical solution as an etchant to remove a portion of the target layer, whereas dry etching uses plasma or an ion beam to remove a portion of the target layer.

However, wet etching is problematic in that the etchant can penetrate between the film of photosensitive material (the mask) and the underlying target layer. In this case, the pattern produced using wet etching does not have the desired profile. Accordingly, wet etching is used restrictively in the fabrication of semiconductor devices. On the other hand, films of photosensitive material remain relatively well adhered to underlying target layers in dry etching processes. Therefore, the patterns formed by dry etching have better (more desired) profiles. Accordingly, dry etching is used more widely than wet etching throughout the industry.

Reactive ion etching is one of the dry etching processes that use plasma. In a direct plasma etch process, an inactive gas (usually argon (Ar)) is injected into a processing chamber, the gas is excited to form a plasma, and the inactive gas ions of the plasma collide with the wafer. The etching thus occurs due to the physical impact of the ions with the target layer. In reactive ion etching, both an inactive gas and a reactive gas (a gas of the halogen group having very strong activity) are injected into the processing chamber. The inactive gas is used to generate the plasma. The reactive gas is adsorbed by the target layer as atoms, ions, radicals and the like. As a result, etching occurs due to the collisions between the inactive gas ions of the plasma and the target layer, and due to a chemical reaction between the atoms, ions, radicals and the target layer.

Although reactive ion etching has several advantages with respect to the forming of fine patterns, polymers comprising Si, F, Cl, Br, $SiO_2$, C, Si—Br, Si—Cl and Si—F are generated inside the processing chamber as by-products of the chemical reaction effected by reactive ion etching. These polymers accumulate on surfaces inside the process chamber and may eventually flake off of as fine particles which float in the air inside the process chamber. Preventing foreign particles from contaminating a wafer, though, is necessary to attain high yields of quality semiconductor devices. In particular, particle control is critical in forming a gate or a trench (key features of a semiconductor device). Accordingly, polymers and residual gases are discharged from the processing chamber using vacuum equipment (turbo pump) after a gate or a trench has been formed. However, there is a limit to the degree to which polymers can be removed from a processing chamber using vacuum equipment.

Thus, a dedicated cleaning process is performed to remove the polymers from the processing chamber after the chamber has been exhausted using vacuum equipment. A conventional cleaning process entails blowing $O_2$ into the process chamber. However, this method is only partly effective in removing polymer from the process chamber. Another conventional cleaning process involves using chemicals, such as $H_2SO_4$, for removing polymer adhering to inner surfaces of the process chamber. However, the use of chemicals, such as $H_2SO_4$, requires opening the process chamber which action can cause lumps of polymer to fall onto a wafer in the process chamber. Although fine particles of the polymer (dust) present in the air inside the process chamber are enough to significantly reduce the reliability and yield of semiconductor devices, lumps of the polymer, which are several hundreds times larger than the dust particles, can create a total process failure if they are allowed to fall onto the wafer.

SUMMARY OF THE INVENTION

Therefore, an object of the present invention is to provide a method of cleaning a processing chamber of semiconductor device fabrication equipment and the like, which is highly effective in removing polymers from inside the processing chamber.

Another object of the present invention is to provide a method of cleaning a processing chamber of semiconductor device fabrication equipment and the like, which is effective in removing a wide range of polymers from inside the processing chamber.

Another object of the present invention is to provide a method by which a processing chamber of semiconductor device fabrication equipment and the like can be cleaned rapidly following the processing of a substrate in the chamber.

Yet another object of the present invention is to provide a method of cleaning a processing chamber of semiconductor device fabrication equipment and the like, which is highly effective in removing polymer from surfaces at each of several distinct regions inside the processing chamber.

According to one aspect of the present invention, there is provided a fabrication method for use in manufacturing semiconductor devices and the like, which includes subjecting a substrate to a fabrication process in a processing chamber, subsequently removing the substrate from the processing chamber, providing cleaning gas including an O-based gas and at least one gas selected from the group consisting of an F-based gas and a Cl-based gas, exciting the cleaning gas to form a plasma, and cleaning the inside the processing chamber using the plasma before any other substrate to be processed is loaded into the chamber.

The cleaning gas may include an F-based gas and an O-based gas. In this case, the cleaning gas preferably consists of $SF_6+O_2$, $NF_3+O_2$, $CF_4+O_2$, or $CHF_3+O_2$. Alternatively, the cleaning gas may include a Cl-based gas and an O-based gas. In this case, the cleaning gas preferably consists of $Cl_2+O_2$. The cleaning gas may include an F-based gas, a Cl-based gas and an O-based gas. In this case, the cleaning gas preferably consists of $CF_4$, $Cl_2$ and $O_2$. The cleaning gas may be injected into the processing chamber and then converted into a plasma or may be converted into a plasma outside the reaction chamber.

According to another aspect of the present invention, there is provided a fabrication method for use in manufacturing semiconductor devices and the like, which includes subjecting a substrate to a fabrication process in a processing chamber that causes polymer to adhere to a surface inside the processing chamber, and subsequently dissolving the polymer in-situ using an F- and O-based plasma etchant, a Cl- and O-based plasma etchant, or an F-, Cl- and O-based plasma etchant.

In the case in which the fabrication process produces a polymer comprising carbon, the plasma etchant is preferably formed by exciting a cleaning gas consisting of $CF_4$ and $O_2$. In the case in which the fabrication process produces a polymer comprising $SiO_2$, the plasma etchant is preferably formed by exciting a cleaning gas consisting of $CF_4$, $Cl_2$, and $O_2$.

According to still another aspect of the present invention, there is provided a fabrication method for use in manufacturing semiconductor devices and the like, which includes cleaning surfaces at different regions inside the processing chamber sequentially using plasma produced according to different process recipes, respectively. In particular, a substrate fabrication process causes polymer to adhere to surfaces at different regions inside the processing chamber, respectively. The polymer is removed from the surfaces in several stages of a cleaning process. The stages are carried out sequentially after the substrate has been removed from the processing chamber.

In each stage, a cleaning gas is excited using a source power to form a plasma. The cleaning gas includes an O-based gas and at least one gas selected from the group consisting of an F-based gas and a Cl-based gas. For example, the cleaning gas preferably consists of $CF_4$, $Cl_2$, and $O_2$ in the case in which the polymer comprises $SiO_2$. The polymer is exposed to the plasma while the pressure inside the processing chamber is maintained at a predetermined level.

Each of the stages of the cleaning process is carried out according to a process recipe. The process recipe specifies the ratio of the volumetric flow rates at which the gases constituting the cleaning gas are to be provided, the pressure to be maintained in the processing chamber, and a magnitude of the source power used to form the plasma. The process recipe may also specify the bias power applied to a lower electrode for imparting directionality to the plasma. The process recipes of the stages of the cleaning process are different from each other, and the process recipe of each stage of the cleaning process is formulated to maximize the effectiveness of the plasma as an etchant in removing the polymer from a particular surface inside the processing chamber.

BRIEF DESCRIPTION OF THE DRAWINGS

The above and other objects, features and advantages of the present invention will become more apparent to those of ordinary skill in the art by referring to the following detailed description of the preferred embodiments thereof made with reference to the attached drawings in which.

DETAILED DESCRIPTION OF THE PREFERRED EMBODIMENTS

Figure 1:
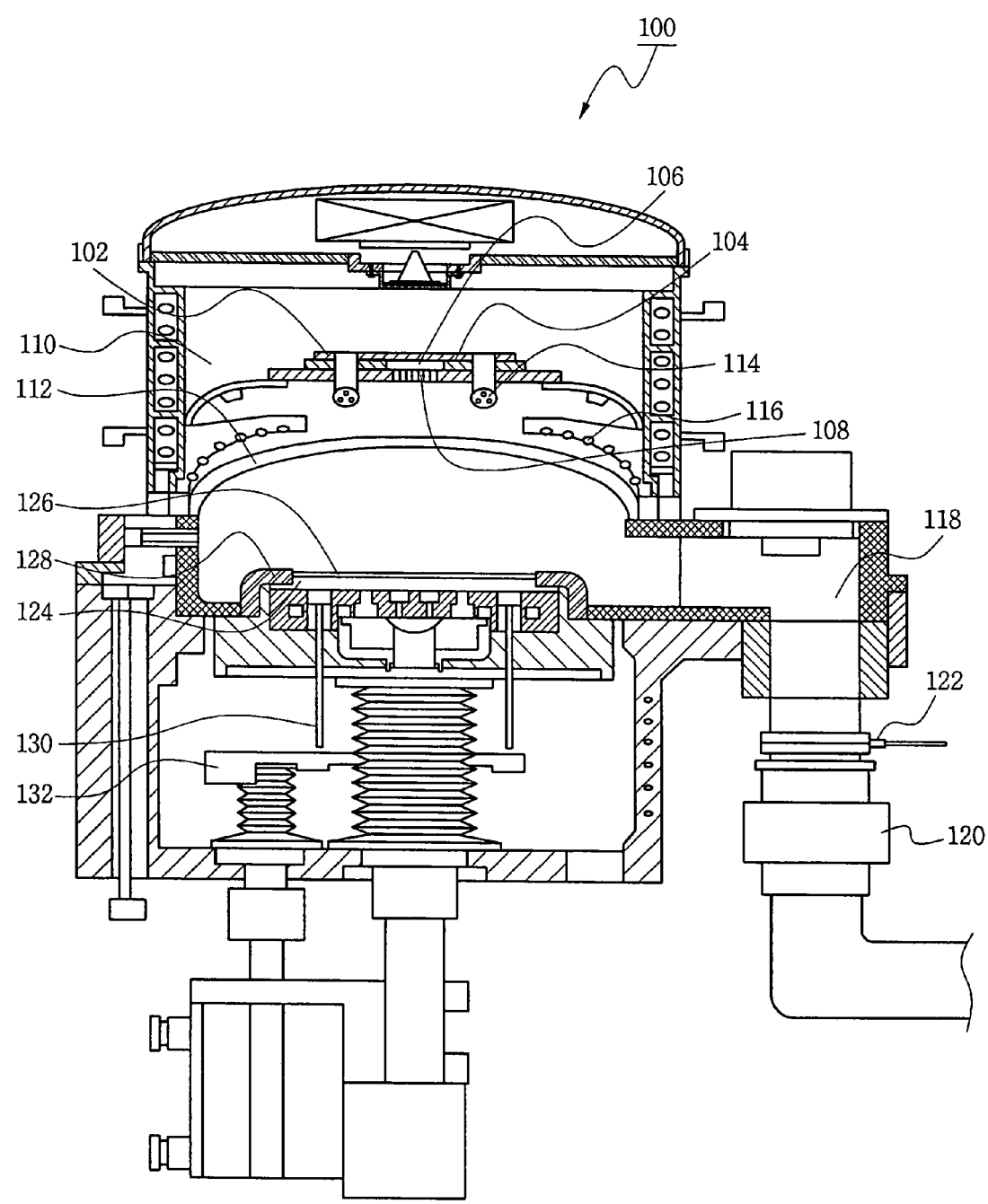
FIG. 1 is a side view, partially in section, of plasma etching equipment that can be used to carry out a plasma cleaning process in accordance with the present invention.

FIG. 1 illustrates plasma etching equipment using a decoupled plasma source (DPS). Plasma etching equipment using a DPS is an example of the type of equipment which can adopt the dry cleaning process in accordance with the present invention. The plasma etching equipment of FIG. 1 is advantageous in that the ion concentration and ion energy can be independently controlled, the process margin is relatively large, and the yield of processed wafers is high. Due to these merits, the plasma etching equipment of the type shown in FIG. 1 is widely used in the field of manufacturing semiconductor devices.

Referring to FIG. 1, an etching process is performed in a processing chamber 100 of the plasma etching equipment. The interior of the processing chamber 100 is divided into an upper portion and a lower portion. A wafer is loaded into the lower portion of the processing chamber 100, and a process gas for use in etching a layer on the wafer is injected into the upper portion of the processing chamber 100.

An upper electrode 102, to which RF power is applied, is disposed in the upper portion of the processing chamber 100. The RF power has a high frequency of about 60 MHz or higher. A shower head 104 is also disposed in the upper portion of the processing chamber 100. The high frequency power is applied to the upper electrode 102 while the process gas is injected into the processing chamber 100 via the shower head 104 to thereby convert the process gas into plasma. The plasma carries out the etching process under a low pressure of 10 mT or less in the processing chamber 100. These conditions are basically known processing conditions for forming a pattern based on a small design rule.

The shower head 104 may be of quartz. Alternatively, the shower head 104 is of ceramics which has excellent strength and insulating characteristics compared to quartz. The process gas is supplied to the shower head 104 through a gas supply conduit (not shown). The shower head 104 defines a buffer space 106 for temporarily storing the process gas, and a plurality of gas spray holes 108 through which the process gas in the buffer space 106 is sprayed into the processing chamber 100.

A dome temp control unit (DTCU) 110 is provided at the upper portion of the processing chamber 100. The DTCU 110 maintains the inside of the processing chamber 100 at an appropriate temperature of about 80° C. To this end, the DTCU includes a dome 112 disposed below the showerhead 104 in the processing chamber 100. The dome 112 may is of a thermal insulating material, such as quartz, alumina, alpha alumina (sapphire), or a ceramic material. The DTCU 110 also includes a number of lamps 114 and a coil 116 disposed above the dome 112. The lamps 114 maintain the inside of the processing chamber 100 at a predetermined temperature. The RF coil 116 provides the RF power for forming plasma. An etching end point sensor (not shown) for detecting the point at which the etching process is to be terminated is provided above the dome 112.

An exhaust line 118 is connected to a side of the processing chamber 100. A turbo pump 120 is disposed in the exhaust line 118. The turbo pump 120 evacuates the inside of the processing chamber 100 to create a predetermined pressure of about 0.1 mT or less inside the processing chamber 100 during the etching process. A gate valve 122 disposed in the exhaust line 118 between the processing chamber 110 and the turbo pump 120 regulates the vacuum pressure of the processing chamber 100. A dry pump (not shown) is connected to the turbo pump 120. The dry pump has an oil coolant system (not shown) for keeping the dry pump cool, and a water line (not shown) through which cooling water flows. The dry pump is generally continuously operated to maintain a vacuum in the processing chamber 100 and in a transfer chamber (not shown) to which the processing chamber 100 is directly connected. The dry pump is also operated along with the turbo pump 120 to discharge residual process gas and by-products of the etching process from the processing chamber 100.

A lower electrode 124 is disposed in the lower portion of the processing chamber 100. A chuck 126 for holding a wafer is disposed on the lower electrode 124. The chuck 126 may be a vacuum chuck but is preferably an electro static chuck (ESC). An RF power of about 2 MHz is applied to the lower electrode 124 to attract ions of the plasma towards the wafer.

A clamp ring 128 extends around the chuck 126. The clamp ring 128 fixes the wafer in position on the chuck 126. The clamp ring 128 is preferably of a material having high strength and excellent corrosion resistance, oxidation resistance and thermal impact resistance. For example, the clamp ring 128 is of silicon carbide (SiC).

An elevator 132 including lift pins 130 is disposed beneath the chuck 126. The lift pins 130 are received in and can slide through openings in the chuck 126 and lower electrode 124. The elevator 132 also includes a driving unit for raising and lowering the lift pins 130 relative to the upper surface of the chuck 126. The lift pins 130 are raised and an unprocessed wafer is transferred to the lift pins 130 through an opening (of a gate valve) in the side of the lower portion of the processing chamber 100. Then, the unprocessed wafer is lowered onto the chuck 126 by lowering the lift pins 130. Conversely, a processed wafer is raised off of the chuck 126 by raising the lift pins 130. Then the processed wafer is transferred out of the processing chamber 100 through the opening in the side of the processing chamber 100.

An etching process used to form a gate will now be described with reference to FIGS. 2A and 2B. However, this is just one application of the etching equipment shown and described above in connection with FIG. 1. The etching process may be used to form other features of semiconductor devices and the like such as bit lines.

Figure 2A:
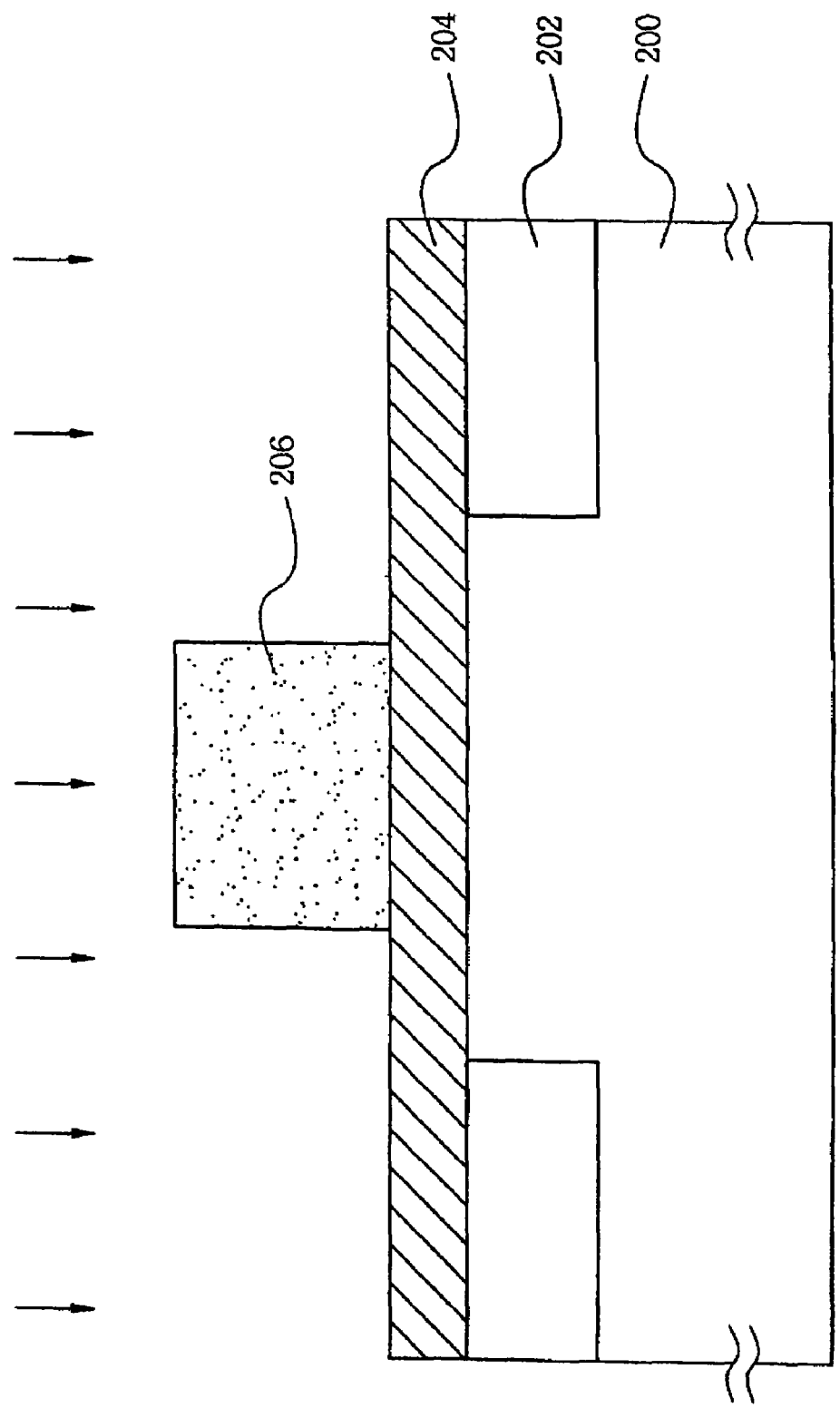
FIGS. 2A and 2B are sectional views of part of a wafer illustrating an etching process in the forming of a gate using the plasma etching equipment of FIG. 1.
Figure 2B:
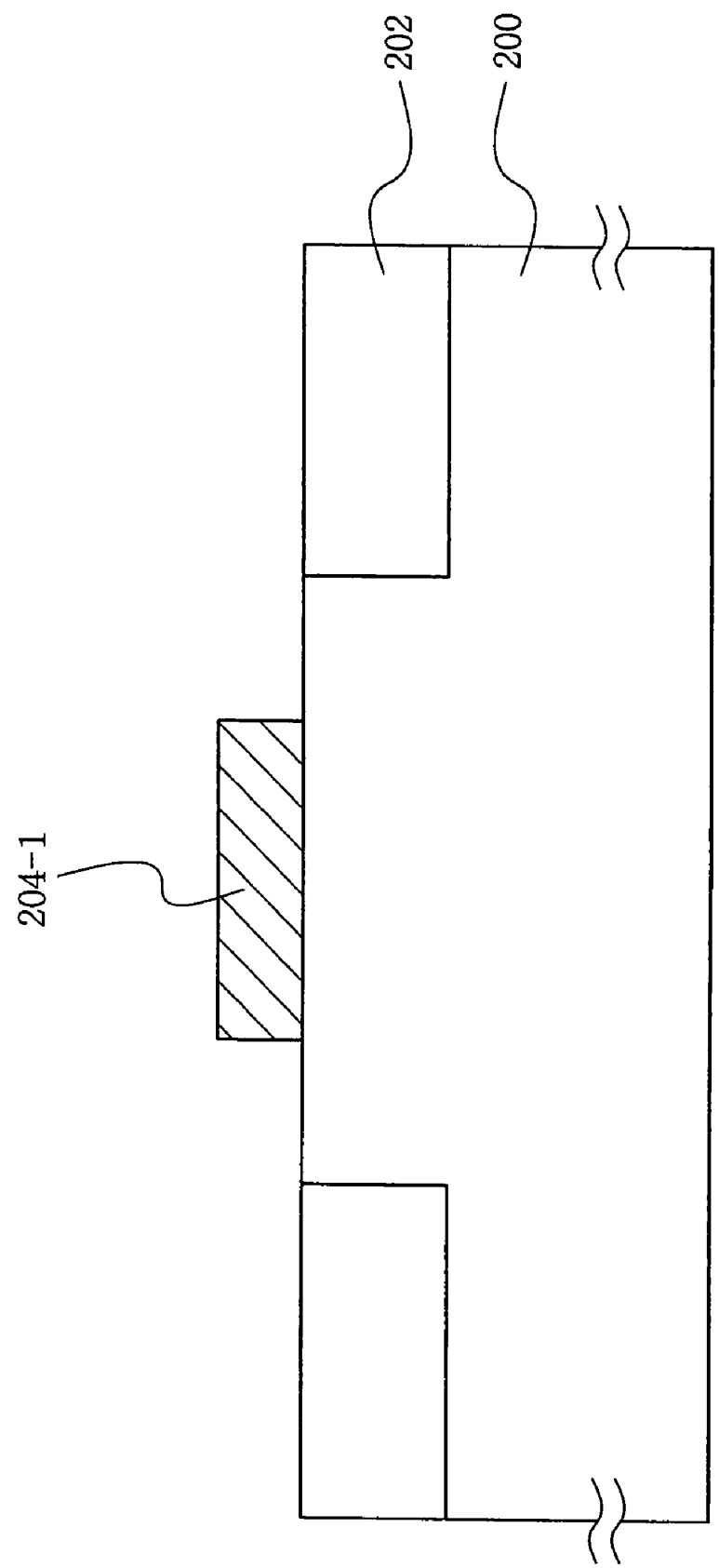

As shown in FIG. 2A, a conductive layer 204 is disposed on a semiconductor substrate 200. The semiconductor substrate 200 has an active region and a field region divided by an isolation layer 202. The isolation layer 202 is formed by a well known shallow trench isolation technique. The conductive layer 204 is to form a gate and may comprise, for example, a polysilicon layer. A mask 206 is disposed on the conductive layer 204 for use in patterning the conductive layer 204. The mask 206 is formed by coating the semiconductor substrate with a layer of photosensitive material, and then subjecting the layer of photosensitive material to typical exposure and developing processes.

The semiconductor substrate 200 as described above is loaded onto the chuck 126 within the processing chamber 100 of the plasma etching equipment. Subsequently, process gas is injected into the processing chamber 100 by the shower head 104. Then, RF power is applied to the upper electrode 102 and the lower electrode 124, thereby generating plasma formed of positive (+) ions, negative (−) ions and radicals inside the processing chamber 100, and the plasma is attracted towards the substrate on the chuck 126. The plasma physically etches the portion of the conductive layer 204 which is exposed by the mask pattern 206. Also, a chemical reaction occurs between the polysilicon of the conductive layer 204 and ions of the plasma. As a result, a gate 204-1 of polysilicon is formed on the semiconductor substrate 200, as shown in FIG. 2B.

Polymers comprising $SiO_2$, Si and the like are generated inside the processing chamber 100 as a result of the etching process that forms the gate 204-1. Gases remaining inside the processing chamber are exhausted from the processing chamber using the turbo pump 120 in an attempt to remove the residual polymers after the plasma etching process has been completed. However, not all of the polymers can be removed from the processing chamber using the vacuum created by the turbo pump 120.

Figure 3:
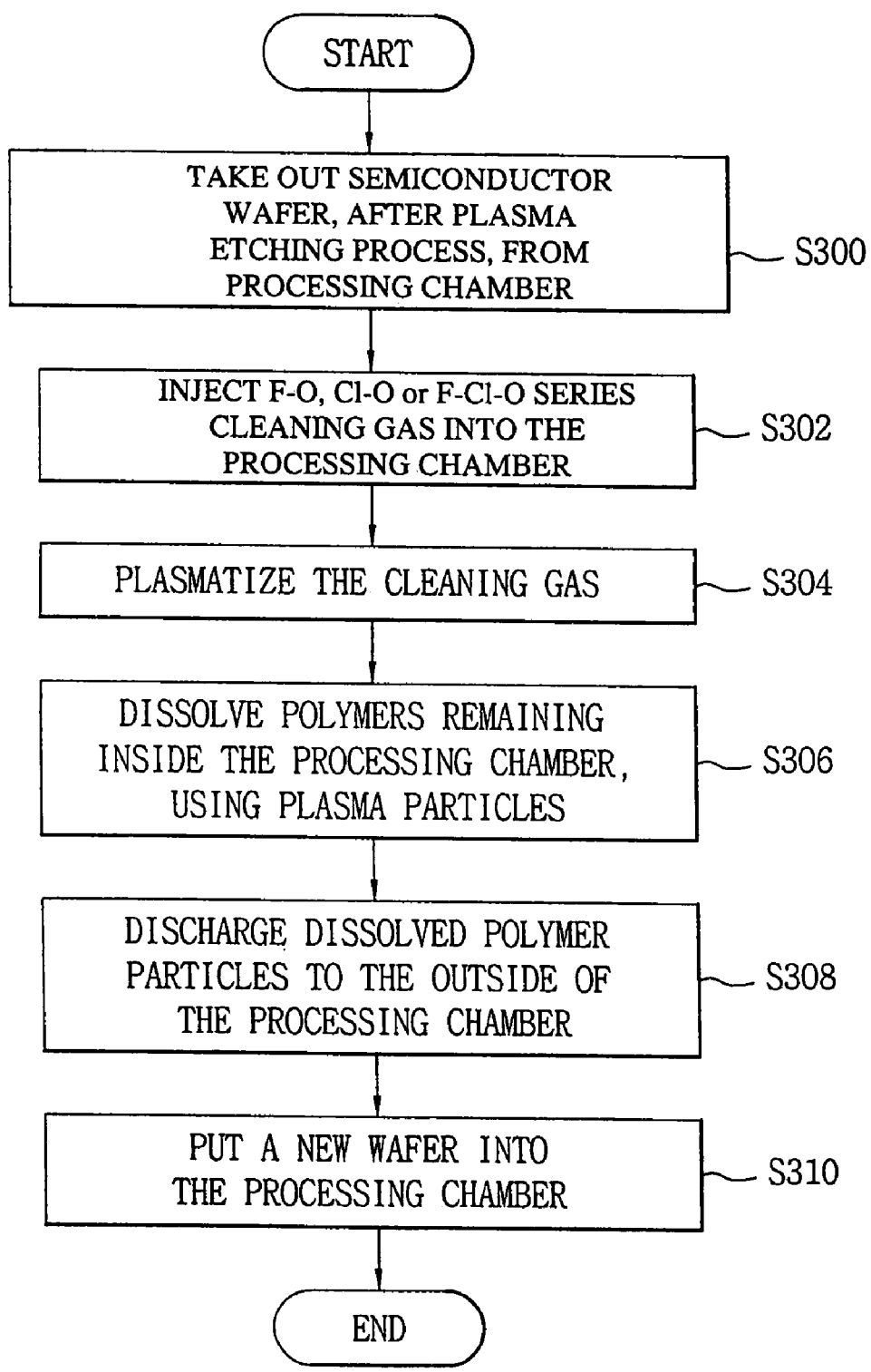
FIG. 3 is a flow chart illustrating a cleaning process in accordance with the present invention.

A cleaning process that will remove the polymers remaining inside the processing chamber 100 in accordance with the present invention will be described, in detail, with additional reference to FIG. 3.

The wafer is taken out of the processing chamber 100 once the gate 204-1 has been formed (S300). Then, the inside of the processing chamber 100 is evacuated using the turbo pump 120 as mentioned above.

Subsequently, a cleaning gas for removing polymers is injected into the processing chamber 100 (S302). The cleaning gas comprises an F and/or Cl-based gas and an O-based gas. More specifically, an F—O gas mixture selected from the group consisting of $SF_6+O_2$, $NF_3+O_2$, $CF_4+O_2$ and $CHF_3+O_2$ may be injected into the processing chamber 100. Alternatively, or in addition, a Cl—O gas mixture such as $Cl_2+O_2$ may be injected into the processing chamber 100. Similarly, an F-based gas, a Cl-based gas, and an O-based gas, such as $CF_4$, $Cl_2$ and $O_2$, may all be injected into the processing chamber 100.

The cleaning gas injected into the processing chamber 100 is then converted to plasma (S304). That is, an environment for exciting the cleaning gas injected is created in the processing chamber. For example, an RF of 1 to 3000 Watts is applied to the upper electrode and a pressure of 1 to 300 mT is maintained inside the processing chamber.

The inside the processing chamber 100 is cleaned by the resulting plasma. More specifically, particles of the plasma dissolve polymers adhered to surfaces within the processing chamber (S306). In this respect, $SF_6$, $NF_3$, $CF_4$, $CHF_3$ and $Cl_2$ break solidified polymers into shorter links to thereby increase the surface area of the solidified polymers. On the other hand, the $O_2$ oxidizes the shortened polymers. The cleaning gas thus has an excellent ability to remove various types of polymers which may be present inside the processing chamber 100, including polymers which comprise F, Cl, Br, C, Si—Br, Si—Cl and Si—F.

As a specific example of the cleaning process described above, $NF_3$ is injected into the processing chamber when it is determined that a polymer comprising $SiO_2$ is present in the processing chamber. Then, active fluorine F is generated inside the processing chamber by the plasma-producing conditions established in the processing chamber. The active fluorine F reacts with the polymer, thereby forming a volatile reactant, $SiF_4$.

The cleaning process in which $NF_3$ is used to remove a polymer comprising $SiO_2$ can be summarized as follows:

The volatile reactant $SiF_4$ and $O_2$ derived from the above-listed chemical reactions are discharged from the processing chamber using the turbo pump (S308). The duration of the cleaning process is controlled based on the amount of polymer to be removed. After the cleaning process is completed, a new wafer is loaded into the clean processing chamber (S310), and a plasma etching process is performed on the new wafer.

The cleaning effect provided by the present invention was confirmed from specific experimental data, which will now be described with reference to FIGS. 4 and 5.

Figure 4:
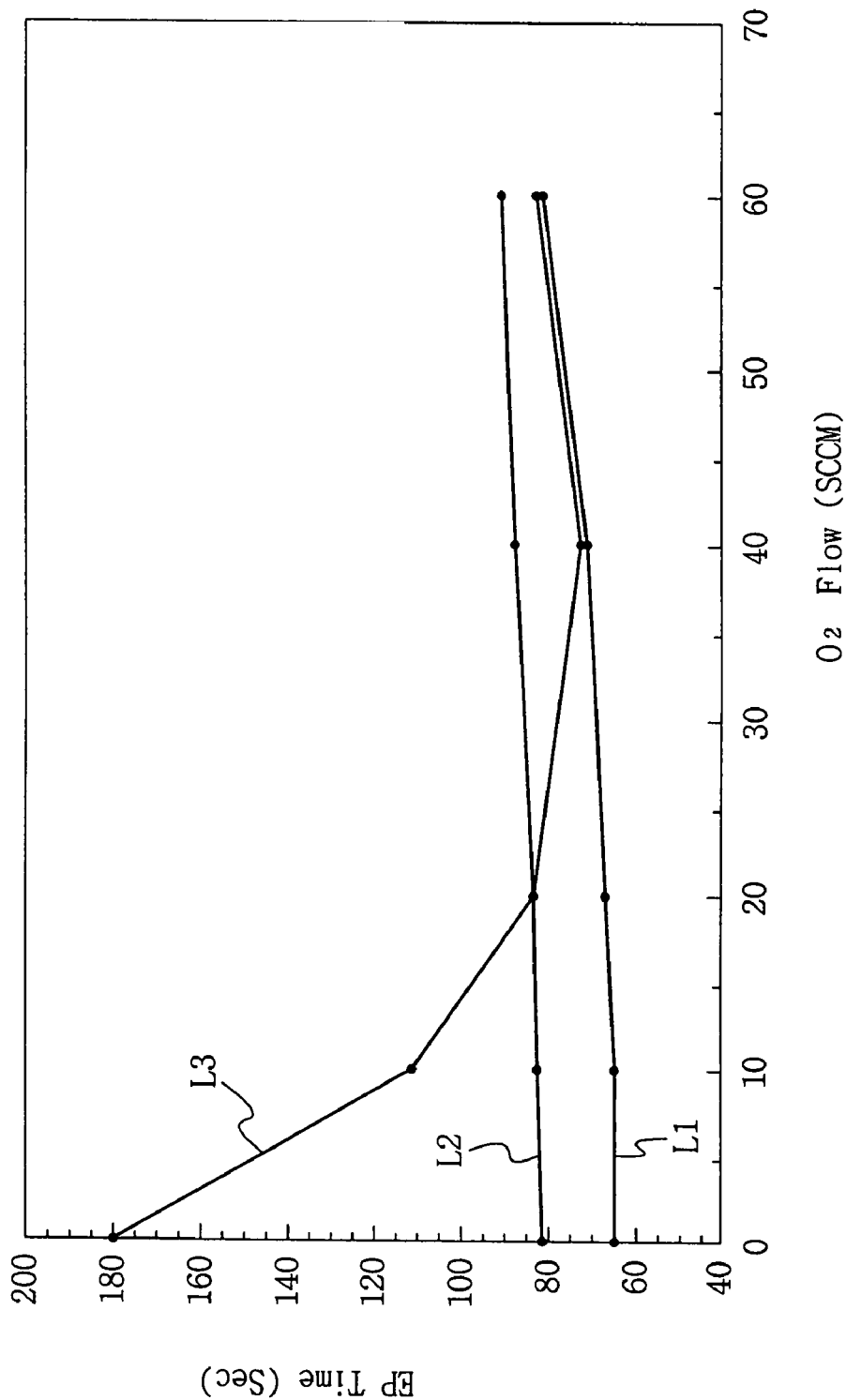
FIG. 4 is a graph of experimental data illustrating the effect of a cleaning process for removing a polymer including carbon from a process chamber, in accordance with the present invention.

FIG. 4 illustrates data of experiments in which polymers comprising carbon were removed from a processing chamber of plasma etching equipment corresponding to that shown in FIG. 1. In these experiments, $NF_3$, $SF_6$ and $CF_4$ were respectively injected into the processing chamber at a rate of 80 SCCM. An RF power of 300 to 1200 Watts was applied to the upper electrode and the pressure in the processing chamber was maintained at 5 to 80 mT to thereby convert the $NF_3$, $SF_6$ and $CF_4$ into plasma. Then, $O_2$ was injected into the processing chamber, and the rate at which the $O_2$ was injected was progressively increased from 0 to 60 SCCM.

In the graph of FIG. 4, plots L1, L2 and L3 are made up of data points in respective cases in which $NF_3$, $SF_6$ and $CF_4$ were injected into the processing chamber. The amount of $O_2$ being injected into the processing chamber in each of these cases is plotted along the X-axis of the graph and the time it took to detect the end point (EP) of the cleaning process is plotted along the Y-axis. The end point detection was carried out in a manner, known per se, by analyzing the wavelength of light reflecting from the surface to which the polymer adheres.

As is illustrated in FIG. 4, the EP detection times were 60 sec. and 80 sec. when $NF_3$ and $SF_6$ were used as the cleaning gases and no $O_2$ was injected into the processing chamber. On the other hand, the cleaning process took 180 sec. when $CF_4$ was used as the cleaning gas under the same condition in which no $O_2$ was injected into the processing chamber. However, the EP detection times for the cases in which $NF_3$ and $SF_6$ were used as the cleaning gases (plots L1 and L2) increased in direct proportion to increases in the rates at which $O_2$ was injected into the processing chamber. This means that the effectiveness of these cleaning processes decreased as the amount of $O_2$ being injected into the processing chamber increased.

That is, the plasma produced using $NF_3$ or $SF_6$ is highly effective in removing the polymers even without the subsequent introduction $O_2$ into the processing chamber. However, the effectiveness decreases slightly as $O_2$ is introduced into the processing chamber and continues to decrease for higher and higher amounts of $O_2$. This is because the surface of the processing equipment to which the polymers are adhered is damaged as the amount of $O_2$ increases, and as a result produces additional amounts of polymer inside the processing chamber.

On the other hand, the EP detection time for the case in which $CF_4$ was used as the cleaning gas (plot L3) was inversely proportional to the rate at which $O_2$ was injected into the processing chamber. That is, the effectiveness of the cleaning process improved for a while as the amount of $O_2$ injected into the processing chamber was progressively increased. In particular, the effectiveness is excellent when $O_2$ is injected into the processing chamber at a rate of about 20 sccm. The polymers are removed even more rapidly, though, when $O_2$ is injected into the processing chamber at a rate of about 40 sccm. However, additional polymers were generated in the equipment when the rate at which the $O_2$ was injected into the processing chamber exceeded 40 sccm. That is, the $O_2$ damaged the equipment. According to the results for $CF_4$ shown in FIG. 4 (plot L3), $O_2$ is preferably injected into the processing chamber at a rate of 10-40 sccm and more preferably, 15 to 25 sccm when $CF_4$ is used. Given that the $CF_4$ was injected into the processing chamber at a rate of 80 sccm, the volumetric flow rate of the $O_2$ should preferably about 18 to 30%, and more preferably 25%, of that of the $CF_4$.

Figure 5:
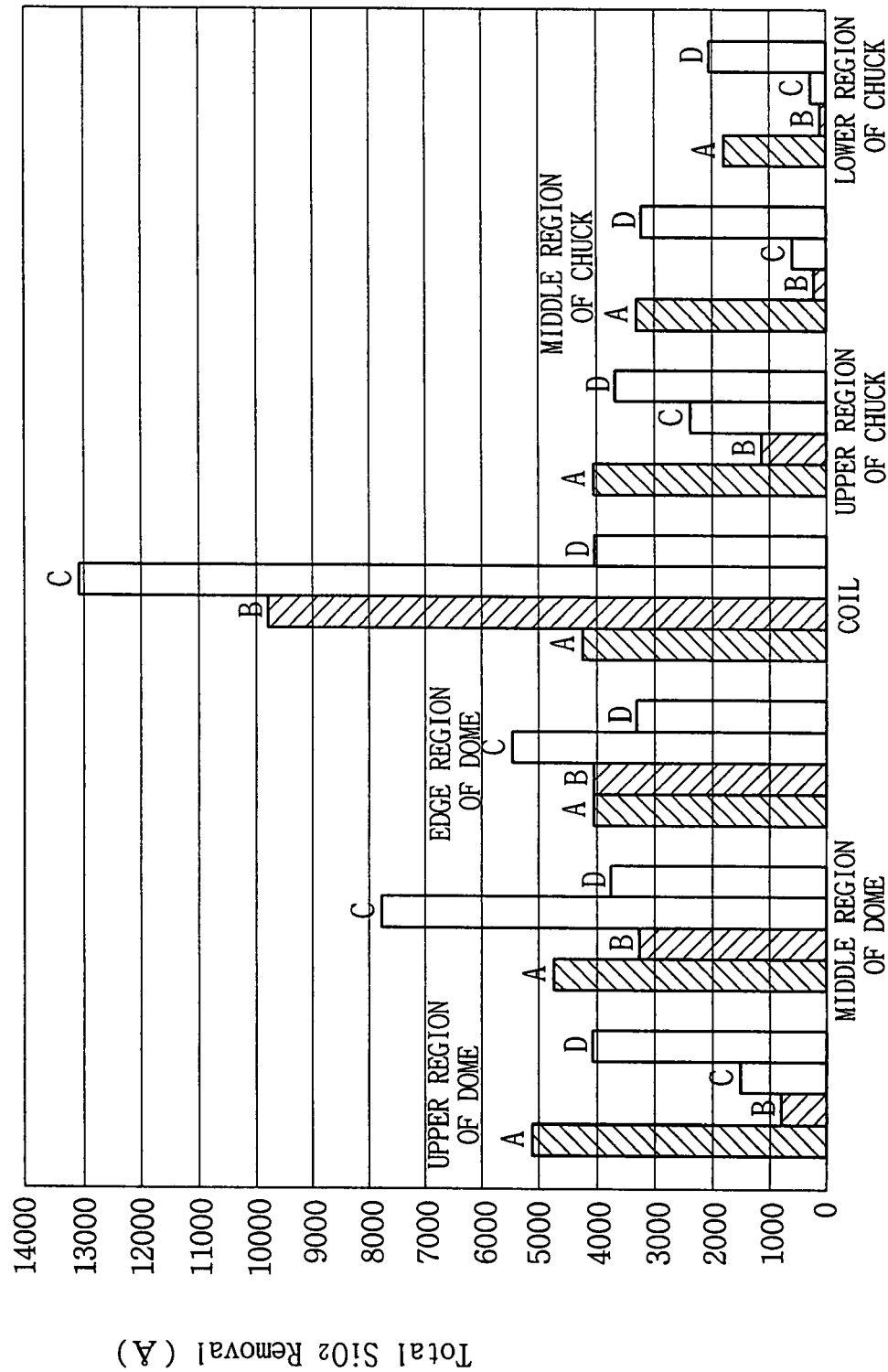
FIG. 5 is a bar graph of experimental data illustrating the effect of a cleaning process for removing a polymer including $SiO_2$, in accordance with the present invention.

FIG. 5 shows the results of experiments in which polymers comprising $SiO_2$ were removed from different surfaces inside the processing chamber. In these experiments, $SiO_2$ coupons were respectively attached to upper, middle and outer peripheral regions of the dome, to the RF coil and to upper middle and lower regions of the chuck inside the processing chamber. A cleaning gas including $CF_4$, $Cl_2$ and $O_2$ was injected at a ratio of 5:5:1 into the processing chamber, and an RF power was applied to the upper electrode to produce plasma in the processing chamber. The experiments were carried out under different process recipes A-D as listed in the Table below:

TABLE

| | $CF_4$ (SCCM) | $Cl_2$ (SCCM) | $O_2$ (SCCM) | Pressure (mT) | Source power (Ws) | Bias power (Wb) | Time (sec) |
|---|---|---|---|---|---|---|---|
| A | 100 | 100 | 20 | 80 | 1600 | 20 | 300 |
| B | 100 | 100 | 20 | 80 | 1600 | 1 | 300 |
| C | 100 | 100 | 20 | 80 | 1600 | 80 | 300 |
| D | 40 | 40 | 8 | 3 | 1600 | 50 | 300 |

As is shown in FIG. 5, the thickness of an $SiO_2$ coupon attached to the upper region of the dome was reduced by about 4000 to 5000 Å when Process Recipes A or D was used. The thickness of an $SiO_2$ coupon attached to the middle region of the dome was reduced by about 8000 Å when Process Recipe C was used. The thicknesses of $SiO_2$ coupons attached to the edge region of the dome were reduced by only slightly different amounts when Process Recipes A, B, C and D were used, respectively. The thicknesses of $SiO_2$ coupons attached to the coil region were reduced by 10,000 Å and 13,000 Å when Process Recipes B and C were used, respectively. The thicknesses of SiO$_2$ coupons attached to the upper, middle and lower regions of the chuck were reduced the most when Process Recipes A and D were used.

According to the present invention, therefore, the cleaning of the processing chamber may be carried out in several stages, the stages being performed according to different process recipes each designed to remove polymer of a particular type from a specific region inside the process chamber. For example, using the results shown in FIG. 5, one stage of the cleaning process may be performed according to Process Recipe A or D to remove the polymers comprising SiO$_2$ from the upper region of the dome, and another stage of the cleaning process may be performed according to Process Recipe C to remove the polymer from the middle region of the dome. Likewise, one stage of the cleaning process may be performed according to Process Recipe B or C to remove the polymers comprising SiO$_2$ from the RF coil, and another stage of the cleaning process may be performed according to Process Recipe A or D to remove the polymer from the chuck.

Although FIGS. 4 and 5 illustrate the results of methods and process recipes which are most effective in removing specific polymers according to the present invention, the present invention is not so limited. That is, as is clear from the earlier part of the detailed description, the present invention entails the use of other F—O based, Cl—O based, F—O and Cl—O based, or F—Cl—O based gas mixtures for removing various polymers from the processing chamber. That is, the cleaning process in accordance with the present invention is highly effective in cleaning surfaces of not only polymers comprising SiO$_2$ or Si which are generated during the forming of a gate, for example, but also is highly effective in cleaning surfaces of polymers comprising other elements such as F, Cl, Br, C, Si—Br, Si—Cl and Si—F.

As described above, in accordance with the present invention, the polymer is dissolved in-situ in the processing chamber after the plasma etching process, using a cleaning gas which is composed of F—O based, Cl—O based, F—O and Cl—O based, or F—Cl—O based gas. As a result, polymers generated inside the processing chamber during the processing of a substrate do not have time to adhere well to surfaces inside of the processing chamber. Accordingly, polymers comprising SiO$_2$, Si, F, Cl, Br, C, Si—Br, Si—Cl or Si—F, for example, are effectively removed from surface inside the processing chamber.

Also, the present invention requires less time for cleaning the processing chamber than conventional cleaning processes, and thereby helps maximize the frequency at which PM (preventative maintenance) must be carried out to deal with contamination of the equipment. Furthermore, the present invention prevents the situation in which polymer falls onto a wafer disposed within or being loaded into the processing chamber. Thus, the present invention contributes to maximizing the quality and yield of semiconductor devices.

Finally, although the present invention has been described in connection with the preferred embodiments thereof, it is to be understood that the scope of the present invention is not so limited. For instance, the present invention has been described in detail above in connection with removing polymers produced by carrying out a plasma etching process. However, the plasma cleaning process in accordance with the present invention may be used for removing polymers generated during a thin film deposition process. Furthermore, the cleaning process of the present invention has been described as including a step of converting the cleaning gas to plasma after the cleaning gas has been injected into the processing chamber. However, the cleaning gas can be converted to plasma outside the processing chamber, by a remote plasma generator, and then the plasma is injected into the processing chamber to clean the inside of the processing chamber. Thus, these and other changes to and modifications of the disclosed embodiments may fall within the true spirit and scope of the invention as defined by the appended claims.

What is claimed is:

1. A fabrication method comprising:
   subjecting a substrate to a fabrication process in a processing chamber that causes polymer to adhere to surfaces at different regions inside the processing chamber, respectively;
   subsequently removing the substrate from the processing chamber; and
   removing the polymer from the surfaces in several stages of a cleaning process, wherein the stages are carried out sequentially, and
   wherein the stages include providing cleaning gas, including an O-based gas and at least one gas selected from the group consisting of an F-based gas and a Cl-based gas,
   exciting the cleaning gas using a source power to form a plasma, and
   exposing the polymer inside the processing chamber to the plasma while regulating the pressure inside the processing chamber,
   wherein each of the stages is carried out according to a process recipe specifying the ratio of the volumetric flow rates at which the gases constituting the cleaning gas are to be provided, the pressure to be maintained in the processing chamber, and the magnitude of the source power used to form the plasma, and
   wherein the process recipes of the stages of the cleaning process are different from each other, and the process recipe of each of the stages is formulated to maximize the effectiveness of the plasma as an etchant in removing the polymer from one of the surfaces.

2. The method according to claim 1, wherein the cleaning gas consists of CF$_4$, Cl$_2$, and O$_2$.

3. The method according to claim 1, wherein the process recipe also includes the magnitude of a bias power applied to an electrode disposed in a lower portion of the processing chamber.

* * * * *